(12) United States Patent
Cai

(10) Patent No.: US 11,894,479 B2
(45) Date of Patent: Feb. 6, 2024

(54) PHOTOSENSITIVE ELEMENT, AND PREPARATION METHOD AND DISPLAY DEVICE THEREOF

(71) Applicant: TCL CHINA STAR OPTOELECTRONICS TECHNOLOGY CO., LTD., Shenzhen (CN)

(72) Inventor: Guangshuo Cai, Shenzhen (CN)

(*) Notice: Subject to any disclaimer, the term of this patent is extended or adjusted under 35 U.S.C. 154(b) by 400 days.

(21) Appl. No.: 17/261,581

(22) PCT Filed: Dec. 31, 2020

(86) PCT No.: PCT/CN2020/142235
§ 371 (c)(1),
(2) Date: Jan. 20, 2021

(87) PCT Pub. No.: WO2022/141432
PCT Pub. Date: Jul. 7, 2022

(65) Prior Publication Data
US 2022/0399470 A1     Dec. 15, 2022

(30) Foreign Application Priority Data
Dec. 30, 2020 (CN) .................. 202011609287.X

(51) Int. Cl.
*H01L 31/109* (2006.01)
*H01L 31/0224* (2006.01)
(Continued)

(52) U.S. Cl.
CPC .......... *H01L 31/109* (2013.01); *G06F 3/0412* (2013.01); *H01L 27/14603* (2013.01);
(Continued)

(58) Field of Classification Search
CPC ......... H01L 27/14607; H01L 27/14678; H01L 27/14603; H01L 31/109; H01L 31/102;
(Continued)

(56) References Cited

U.S. PATENT DOCUMENTS

| 2002/0076844 A1* | 6/2002 | Possin | H01L 27/14692 |
| | | | 257/E21.414 |
| 2014/0061550 A1* | 3/2014 | Choy | C01G 41/02 |
| | | | 423/592.1 |

(Continued)

FOREIGN PATENT DOCUMENTS

| CN | 101645454 A | 2/2010 |
| CN | 101753861 A | 6/2010 |

(Continued)

OTHER PUBLICATIONS

Battaglia, Corsin & Yin, Xingtian & Zheng, Maxwell & Sharp, Ian & Chen, Teresa & Azcatl, Angelica & McDonnell, Stephen & Carraro, C. & Maboudian, Roya & Wallace, Robert & Javey, Ali. (2014). Hole Selective MoOx Contact for Silicon Solar Cells. Nano letters. 14. 10.1021/nl404389u. (Year: 2014).*

(Continued)

*Primary Examiner* — Alia Sabur

(57) ABSTRACT

The present invention provides a photosensitive element, and a preparation method and a display device thereof. The photosensitive element includes a substrate; a first electrode arranged on the substrate; an N-type doped silicon layer arranged on the first electrode; an undoped silicon layer arranged on the N-type doped silicon layer; a molybdenum oxide layer arranged on the undoped silicon layer; an insulating layer arranged on the molybdenum oxide layer and the substrate, wherein a first opening is arranged on the insulating layer to expose the molybdenum oxide layer; and a second electrode arranged on the insulating layer and the (Continued)

molybdenum oxide layer, wherein the second electrode contacts the molybdenum oxide layer through the first opening.

8 Claims, 5 Drawing Sheets

(51) Int. Cl.
*H10K 59/60* (2023.01)
*G06F 3/041* (2006.01)
*H01L 27/146* (2006.01)
*H01L 31/0264* (2006.01)
*H01L 31/0336* (2006.01)
*H01L 31/18* (2006.01)

(52) U.S. Cl.
CPC .. *H01L 27/14607* (2013.01); *H01L 27/14612* (2013.01); *H01L 27/14678* (2013.01); *H01L 31/0264* (2013.01); *H01L 31/022408* (2013.01); *H01L 31/0336* (2013.01); *H01L 31/18* (2013.01); *H10K 59/60* (2023.02)

(58) Field of Classification Search
CPC ............. H01L 31/022408; H01L 31/18; H01L 27/124; H01L 29/78669; H01L 29/66765; H01L 2933/0016; H01L 27/14643; H10K 59/60; G06F 18/00; G06F 3/0412; G06V 40/1318
See application file for complete search history.

(56) References Cited

U.S. PATENT DOCUMENTS

| | | | |
|---|---|---|---|
| 2014/0225194 A1* | 8/2014 | Chang | H01L 29/66969 438/151 |
| 2019/0190438 A1 | 6/2019 | Hack | |
| 2021/0050469 A1* | 2/2021 | Zhou | H01L 31/02161 |
| 2022/0123030 A1* | 4/2022 | Luo | H01L 27/124 |
| 2022/0190185 A1* | 6/2022 | Yuan | H10K 30/10 |

FOREIGN PATENT DOCUMENTS

| | | |
|---|---|---|
| CN | 104282678 A | 1/2015 |
| CN | 109360838 A | 2/2019 |
| CN | 111599879 A | 8/2020 |
| CN | 111599890 A | 8/2020 |
| CN | 111830743 A | 10/2020 |
| JP | 2001167808 A | 6/2001 |
| JP | 2007081203 A | 3/2007 |

OTHER PUBLICATIONS

International Search Report in International application No. PCT/CN2020/142235, dated Sep. 29, 2021.
Written Opinion of the International Search Authority in International application No. PCT/CN2020/142235, dated Sep. 29, 2021.
Chinese Office Action issued in corresponding Chinese Patent Application No. 202011609287.X dated Jan. 17, 2022, pp. 1-10.

* cited by examiner

PHOTOSENSITIVE ELEMENT, AND PREPARATION METHOD AND DISPLAY DEVICE THEREOF

BACKGROUND OF INVENTION

Field of Invention

The invention relates to the field of display technology and in particular to a photosensitive element, and a preparation method and a display device thereof.

Description of Prior Art

With development of science and technology, using fingerprints, voices, faces, hands, retinas, or irises in personal identification systems has become a safe and reliable biometric technology. In terms of cost, ease of use, and accuracy, fingerprint identification has become a leading method for identity verification, replacing conventional passwords and keys. Traditional optical sensor for fingerprint identification has some problems, such as high cost, large size, and image distortion. Photosensitive devices based on silicon chips are popular because they can be made very small and cheap. However, P-type materials are usually used to form homojunction or heterojunction structures for the photosensitive devices based on silicon chips. However, preparation of P-type materials increases cost, and low hole transport efficiency of P-type materials will affect a performance of the photosensitive devices.

Therefore, it is necessary to provide a photosensitive element, and a preparation method and a display device thereof to solve the problems existing in the prior art.

SUMMARY OF INVENTION

The invention provides a photosensitive element, and a preparation method and a display device thereof, which can solve the technical problems of high cost and low hole transmission efficiency caused by the adoption of P-type material in the photosensitive element in the prior art.

To solve the above problems, the technical scheme provided by the invention is as follows:

The invention provides a photosensitive element, comprising:
  a substrate;
  a first electrode arranged on the substrate;
  an N-type doped silicon layer arranged on the first electrode;
  an undoped silicon layer arranged on the N-type doped silicon layer;
  a molybdenum oxide layer arranged on the undoped silicon layer;
  an insulating layer arranged on the molybdenum oxide layer and the substrate, wherein a first opening is arranged on the insulating layer to expose the molybdenum oxide layer; and
  a second electrode arranged on the insulating layer and the molybdenum oxide layer, wherein the second electrode contacts the molybdenum oxide layer through the first opening.

In the photosensitive element of the present invention, the first electrode comprises a first region configured to lap with a lead wire and a second region configured to contact the N-type doped silicon layer, and the N-type doped silicon layer, the undoped silicon layer, the molybdenum oxide layer, and the second electrode are arranged corresponding to the second region.

In the photosensitive element of the present invention, the first electrode comprises a single-layer structure or a multi-layer structure formed by at least one metal material of molybdenum, copper, aluminum, titanium, nickel or cadmium, and the second electrode comprises a single-layer structure or a multi-layer structure formed by at least one metal oxide material of indium zinc oxide, indium tin oxide, zinc oxide, or gallium zinc oxide.

In the photosensitive element of the present invention, a work function of the molybdenum oxide layer ranges from 5.2 eV to 6.8 eV.

In the photosensitive element of the present invention, a forbidden bandwidth of the molybdenum oxide layer ranges from 2.8 eV to 3.6 eV.

To solve the above problem, the invention also provides a preparation method of a photosensitive element, comprising following steps of:
  Step S1, forming a plurality of first electrodes on a substrate;
  Step S2, successively forming an N-type doped silicon layer, an undoped silicon layer and a molybdenum oxide layer on the plurality of first electrodes;
  Step S3, preparing an insulating layer on the molybdenum oxide layer and the substrate, and forming a first opening exposing the molybdenum oxide layer on the insulating layer; and
  Step S4, forming a second electrode corresponding to the molybdenum oxide layer on the insulating layer, wherein the second electrode contacts the molybdenum oxide layer through the first opening.

In the preparation method of the invention, the first electrode comprises a single-layer structure or a multi-layer structure formed by at least one metal material of molybdenum, copper, aluminum, titanium, nickel, or cadmium; the first electrode comprises a first region configured to lap with a lead wire and a second region configured to contact the N-type doped silicon layer; and the N-type doped silicon layer, the undoped silicon layer, the molybdenum oxide layer, and the second electrode are arranged corresponding to the second region.

In the preparation method of the invention, when a material of the first electrode with the single-layer structure is molybdenum titanium alloy, or a material of a sublayer close to a side of the N-type doped silicon layer in the first electrode with the multi-layer structure is molybdenum titanium alloy, after preparing the insulating layer on the molybdenum oxide layer and the substrate, the step S3 further comprises following steps:
  patterning the insulating layer to simultaneously form the first opening exposing the molybdenum oxide layer and a second opening exposing the second region of the first electrode, and then annealing the molybdenum oxide layer at an annealing temperature less than or equal to 350° C.

In the preparation method of the invention, when a material of the first electrode with the single-layer structure is a material other than molybdenum titanium alloy, or a material of a sublayer close to a side of the N-type doped silicon layer in the first electrode with the multi-layer structure is a material other than molybdenum titanium alloy, after preparing the insulating layer on the molybdenum oxide layer and the substrate, the step S3 further comprises following steps:

patterning the insulating layer for a first time to form the first opening exposing the molybdenum oxide layer and annealing the molybdenum oxide layer; then patterning the insulating layer for a second time to form a second opening exposing the second region of the first electrode.

In the preparation method of the invention, a work function of the molybdenum oxide layer ranges from 5.2 eV to 6.8 eV.

In the preparation method of the invention, a forbidden bandwidth of the molybdenum oxide layer ranges from 2.8 eV to 3.6 eV.

To solve the above problem, the invention also provides a display device, comprising a photosensitive element and pixel units, wherein the photosensitive element is located between two adjacent pixel units, the photosensitive element comprising:

a substrate;
a first electrode arranged on the substrate;
an N-type doped silicon layer arranged on the first electrode;
an undoped silicon layer arranged on the N-type doped silicon layer;
a molybdenum oxide layer arranged on the undoped silicon layer;
an insulating layer arranged on the molybdenum oxide layer and the substrate, wherein a first opening is arranged on the insulating layer to expose the molybdenum oxide layer; and
a second electrode arranged on the insulating layer and the molybdenum oxide layer, wherein the second electrode contacts the molybdenum oxide layer through the first opening.

In the display device of the present invention, the display device comprises a first substrate and a second substrate arranged opposite to each other, and the first substrate comprises:

a first base;
a first electrode layer arranged on the first base, comprising the first electrode and a gate electrode arranged in a same layer and at intervals;
a gate insulating layer arranged on the first electrode layer, wherein the gate insulating layer exposes the first electrode;
the N-type doped silicon layer, the undoped silicon layer, and the molybdenum oxide layer arranged on the first electrode in sequence;
an active layer arranged at a position where the gate insulating layer faces the gate electrode, wherein the active layer comprises an undoped part and a doped part;
a source electrode and a drain electrode arranged on the active layer, wherein the source electrode and the drain electrode are each in contact with the doped part;
a dielectric layer arranged on the molybdenum oxide layer, the source electrode, and the drain electrode, wherein the dielectric layer exposes the molybdenum oxide layer and the drain electrode; and
the second electrode arranged on the dielectric layer, wherein one end of the second electrode is in contact with the molybdenum oxide layer, and another end of the second electrode is in contact with the drain electrode.

In the display device of the present invention, the gate electrode, the active layer, the source electrode and the drain electrode constitute a switching thin film transistor, and the photosensitive element is electrically connected with the switching thin film transistor.

In the display device of the present invention, a side of the second substrate facing the first substrate is provided with a black matrix, and the switching thin film transistor is disposed corresponding to the black matrix.

In the display device of the present invention, the first substrate further comprises a scanning line and a reading line, the gate electrode of the switching thin film transistor is electrically connected with the scanning line, the source electrode of the switching thin film transistor is electrically connected with the reading line, and the drain electrode of the switching thin film transistor is electrically connected with the second electrode of the photosensitive element.

In the display device of the present invention, the first electrode comprises a first region configured to lap with a lead wire and a second region configured to contact the N-type doped silicon layer, and the N-type doped silicon layer, the undoped silicon layer, the molybdenum oxide layer, and the second electrode are arranged corresponding to the second region.

In the display device of the present invention, the first electrode comprises a single-layer structure or a multi-layer structure formed by at least one metal material of molybdenum, copper, aluminum, titanium, nickel or cadmium, and the second electrode comprises a single-layer structure or a multi-layer structure formed by at least one metal oxide material of indium zinc oxide, indium tin oxide, zinc oxide, or gallium zinc oxide.

In the display device of the present invention, a work function of the molybdenum oxide layer ranges from 5.2 eV to 6.8 eV.

In the display device of the present invention, a forbidden bandwidth of the molybdenum oxide layer ranges from 2.8 eV to 3.6 eV.

The beneficial effects of the invention are as follows: the photosensitive element and its preparation method and display device adopt molybdenum oxide layer to replace the P-type material with homojunction or heterojunction structure in the prior art, so as to reduce the preparation demand of P-type material, not only saving cost, but also improving the hole transmission efficiency of the photosensitive element, and further improving the performance of the photosensitive element.

BRIEF DESCRIPTION OF DRAWINGS

The technical solution and other beneficial effects of the application will be obvious through the detailed description of the specific implementation mode of the application in combination with the drawings.

DETAILED DESCRIPTION OF EMBODIMENTS

Figure 1:
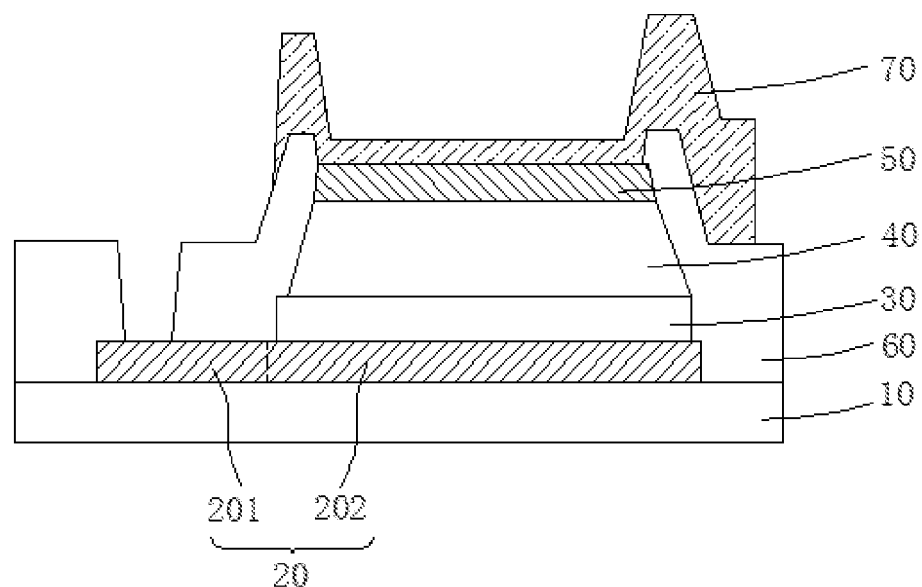
FIG. 1 is a structural diagram of a photosensitive element provided by the present invention.

The technical scheme in the embodiment of the present invention will be described clearly and completely in combination with the drawings in the embodiment of the invention. Obviously, the described embodiments are only part of the embodiments of the present invention, not all of them. Based on the embodiments of the invention, all other embodiments obtained by those skilled in the art without making creative work belong to the protection scope of the invention.

In the description of the invention, it should be understood that the orientation or position relationship indicated by the terms "longitudinal", "transverse", "length", "width", "up", "down", "front", "back", "left", "right", "vertical" and "horizontal" is based on the orientation or position relationship shown in the drawings, which is only for the convenience of describing the invention and simplifying the description. It is not intended to indicate or imply that the device or element referred to must have a specific orientation, be constructed and operated in a specific orientation, and therefore cannot be understood as a limitation of the present invention. In addition, the terms "first" and "second" are used for descriptive purposes only and cannot be understood as indicating or implying relative importance or implicitly indicating the number of technical features indicated. Thus, the features defined as "first" and "second" may explicitly or implicitly comprise one or more of the features. In the description of the invention, "multiple" means two or more, unless otherwise specifically defined.

The present invention may repeat reference numerals and/or reference letters in different examples for the purpose of simplification and clarity, and does not in itself indicate the relationship between the various embodiments and/or settings discussed.

The invention aims at the technical problems of high cost and low hole transmission efficiency of the photosensitive element in the prior art due to the adoption of P-type material, and the embodiment of the invention can solve the defects.

Referring to FIG. 1, the invention provides a photosensitive element, comprising: a substrate 10; a first electrode 20 arranged on the substrate 10; an N-type doped silicon layer 30 arranged on the first electrode 20; an undoped silicon layer 40 arranged on the N-type doped silicon layer 30; a molybdenum oxide layer 50 arranged on the undoped silicon layer 40; an insulating layer 60 arranged on the molybdenum oxide layer 50 and the substrate 10, wherein a first opening is arranged on the insulating layer 60 to expose the molybdenum oxide layer 50; and a second electrode 70 arranged on the insulating layer 60 and the molybdenum oxide layer 50, wherein the second electrode 70 contacts the molybdenum oxide layer 50 through the first opening. Among them, the photosensitive element can be applied to a variety of scenes, and for example, the photosensitive element can be applied to a sensor for fingerprint identification.

The N-type doped silicon layer 30 is configured as the electron transport layer of the photosensitive element, the undoped silicon layer 40 is configured as the light absorption layer of the photosensitive element, and the molybdenum oxide layer 50 is configured as the hole transport layer of the photosensitive element. And the N-type doped silicon layer 30, the undoped silicon layer 40, and the molybdenum oxide layer 50 form a heterojunction structure of the photosensitive element.

The invention adopts the molybdenum oxide layer with high work function to replace the P-type material in the homojunction or heterojunction structure of the prior art, which can effectively improve hole transmission efficiency of the photosensitive element and reduce the preparation demand for the P-type material, thus saving cost.

The photosensitive element and its preparation method of the invention are described in detail in combination with specific examples.

Please refer to FIG. 1. FIG. 1 is a structural diagram of the photosensitive element provided by the invention. The photosensitive element comprises a first electrode 20, an N-type doped silicon layer 30, an undoped silicon layer 40, a molybdenum oxide layer 50, an insulating layer 60, and a second electrode 70 disposed on the substrate 10.

The material of the substrate 10 comprises at least one of glass, alumina, silicon, polyethylene naphthalate, polyethylene terephthalate, or polyimide.

The first electrode 20 comprises a monolayer or multilayer structure formed by at least one metal material of molybdenum (MO), copper (Cu), aluminum (AL), titanium (TI), nickel (Ni), or cadmium (CD). Specifically, the first electrode 20 may comprise at least two sublayers, and the material of the at least two sublayers may be same or different. For example, the first electrode 20 comprises a molybdenum metal sublayer, a copper metal sublayer, and a molybdenum metal sublayer stacked from bottom to top; a molybdenum metal sublayer, an aluminum metal sublayer, and a molybdenum metal sublayer stacked; an aluminum metal sublayer and a molybdenum metal sublayer stacked; a molybdenum titanium alloy sublayer, a copper metal sublayer, and a molybdenum titanium alloy sublayer stacked; or a molybdenum titanium alloy sublayer stacked; a nickel metal sublayer, a copper metal sublayer, and nickel metal sublayer stacked; a cadmium metal sublayer, an aluminum metal sublayer, and cadmium metal sublayer stacked; or other laminated metal layers.

The first electrode 20 comprises a first region 201 configured to lap with a lead wire and a second region 202 configured to contact the N-type doped silicon layer; the N-type doped silicon layer 30, the undoped silicon layer 40, the molybdenum oxide layer 50, and the second electrode 70 are arranged in layers corresponding to the second region 202; and the first region 201 of the first electrode 20 is configured for subsequent lead-lapping between the photosensitive element and other parts of the sensor.

The undoped silicon layer 40 is an intrinsic semiconductor silicon layer, and the N-type doped silicon layer 30 contains N-type impurities, such as pentavalent elements phosphorus, arsenic, antimony, etc. The materials of the N-type doped silicon layer 30 and the undoped silicon layer 40 are not limited to amorphous silicon, microcrystalline silicon, and polycrystalline silicon.

In this embodiment, the work function of the molybdenum oxide layer 50 ranges from $8.3 \times 10^{-19}$ joules to $10.9 \times 10^{-19}$ joules (i.e., 5.2 ev-6.8 ev), and the forbidden bandwidth ranges from $4.5 \times 10^{-19}$ joules to $5.8 \times 10^{-19}$ joules (i.e., 2.8 ev-3.6 ev). Compared with the P-type material in the homojunction or heterojunction structure of the prior art, the molybdenum oxide layer 50 with the work function within this range as the hole transport layer can greatly improve the efficiency of hole injection.

The second electrode 70 comprises a single-layer or a multi-layer structure formed by at least one metal oxide material of indium zinc oxide, indium tin oxide, zinc oxide, or gallium zinc oxide.

In the photosensitive element of this embodiment, light needs to pass through the second electrode 70 and the molybdenum oxide layer 50 to the undoped silicon layer 40, so the materials of the second electrode 70 and the molybdenum oxide layer 50 need to be transparent materials to reduce additional absorption of light, so as to increase effective absorption of light by the undoped silicon layer 40 and generate more photo-generated carriers.

In this embodiment, the first electrode 20 is configured to load a first polarity voltage and provide a first type of carriers, and the second electrode 70 is configured to load a second polarity voltage and provide a second type of carriers. The N-type doped silicon layer 30 is configured as an electron transport layer for transmitting the first type of carriers to the undoped silicon layer 40, and the molybdenum oxide layer 50 is configured as a hole transport layer for transmitting the second type of carriers to the undoped silicon layer 40. The undoped silicon layer 40 is configured as a light absorption layer for generating photo-generated carriers.

In this embodiment, the photosensitive element with molybdenum oxide as the hole transport layer replaces the photodiode with homojunction or heterojunction formed by P-type material in the prior art, which can effectively improve the hole transport efficiency of the device, make the photosensitive element have higher quantum efficiency, improve the light response rate at the same time, and further improve the sensitivity of the photosensitive element. The working voltage of the photosensitive element is reduced to achieve low power consumption.

Figure 2:
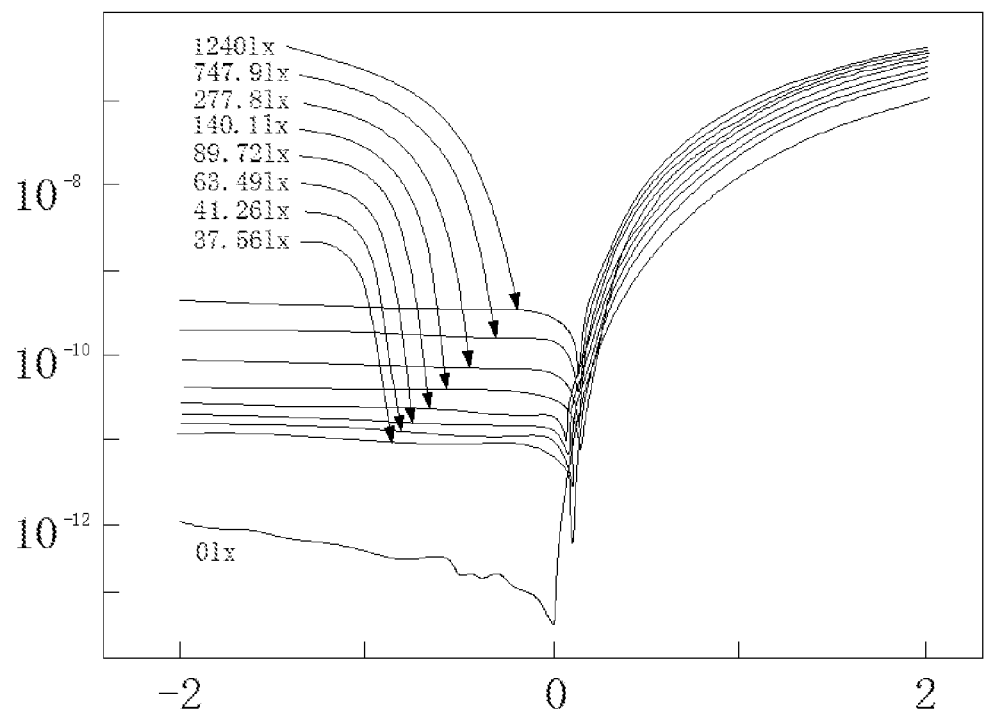
FIG. 2 is an IV characteristic curve of the photosensitive element of the present invention under different white light intensities.
Figure 3:
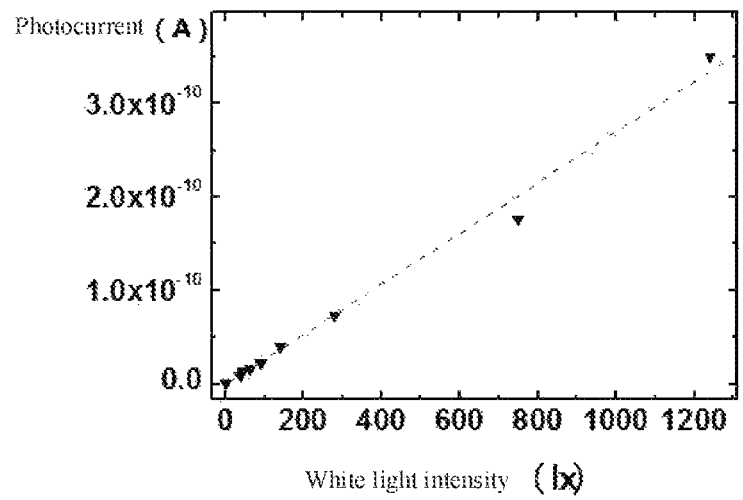
FIG. 3 is a parameter diagram of response photocurrent of different white light intensities of the photosensitive element of the present invention under the voltage of −0.5V.

Please refer to FIG. 2-FIG. 3. FIG. 2 is an IV characteristic curve of the photosensitive element of the invention under different white light intensities, and FIG. 3 is a parameter diagram of the response photocurrent of the photosensitive element of the invention under different white light intensities under the voltage of −0.5V In FIG. 2, when the working voltage is −2V to 2V, the white light intensity is between 0 lx and 1240 lx, and the IV characteristic curves of the photosensitive element under white light intensities of 0 lx, 37.56 lx, 41.26 lx, 63.49 lx, 89.72 lx, 140.1 lx, 277.8 lx, 747.9 lx and 1240 lx are shown. As can be seen from FIG. 2, with the increase in white light intensity, the photocurrent also increases. For example, under the working voltage of −2V, when the light intensity is 0 lx, the photocurrent is $10^{-12a}$; when the light intensity is 63.49 lx, the photocurrent is $10^{-11a}$; and when the light intensity is 277.8 lx, the photocurrent is $10^{-10a}$.

As shown in FIG. 3, the photocurrent parameters under the above-mentioned nine white light intensities are given when the working voltage of the photosensitive element is −0.5V. It can be seen that with the increase in white light intensity, the photocurrent also increases, so the light response also increases.

Compared with the photosensitive element of the prior art, under two different white light intensities, the photocurrent difference of the photosensitive element of the invention is greater than that of the photosensitive element of the prior art. Because the larger the photocurrent difference is, the higher the resolution of the photosensitive element is, the resolution of the photosensitive element of the invention is greatly improved, and the light response rate of the photosensitive element can be improved, so as to improve the resolution of the photosensitive element. Meanwhile, the light response rate of the photosensitive element can be improved, thereby increasing the sensitivity of the photosensitive element. In addition, the working voltage of the photosensitive element of the invention is less than 1V, as shown in FIG. 3, it can work normally under the voltage of −0.5V, and low power consumption can be realized.

In the present invention, the N-type doped silicon layer 30, the undoped silicon layer 40, and the molybdenum oxide layer 50 can be configured as dielectric layers, and capacitor is formed between the first electrode 20 and the second electrode 70. Due to the large junction capacitor of the heterojunction itself, it can be configured as the storage capacitor in the circuit. The application of the photosensitive element in the fingerprint sensor can improve the resolution of the fingerprint sensor and identify finer patterns.

Figure 4:
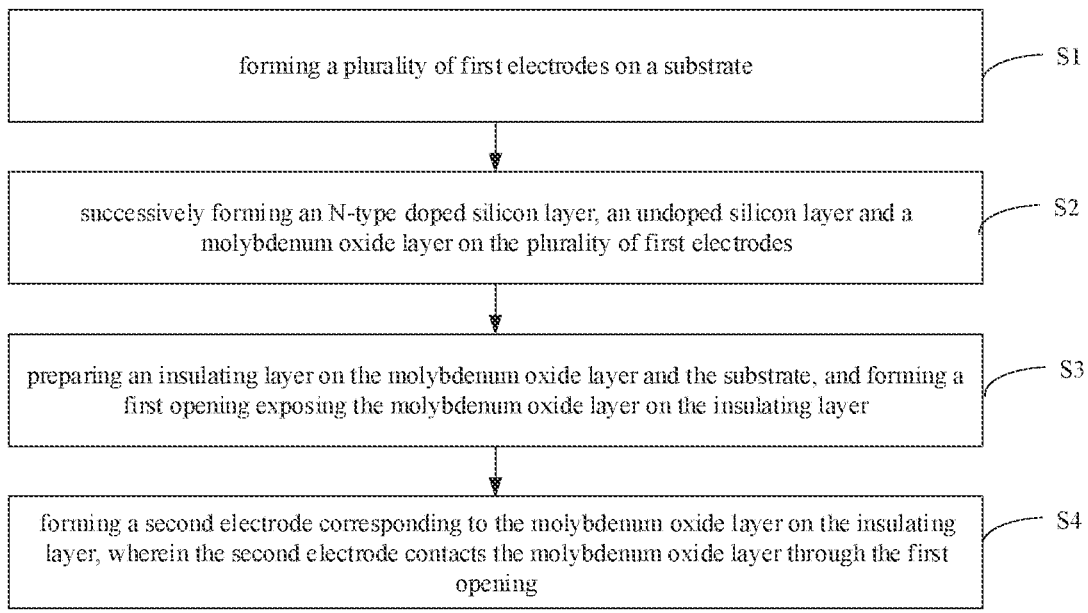
FIG. 4 is a flowchart of a preparation method of the photosensitive element provided by the present invention.

The invention also provides a method for preparing a photosensitive element. Please refer to FIG. 4. FIG. 4 is a flowchart of the method for preparing the photosensitive element provided by the invention. The preparation method comprises the following steps:

Step S1, forming a plurality of first electrodes on a substrate.

Figure 5A:
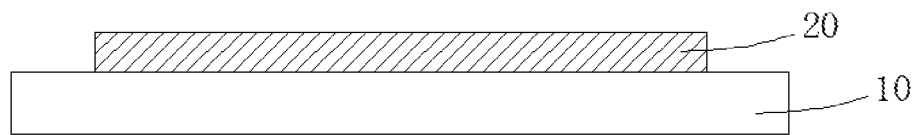
FIG. 5A-FIG. 5E are schematic flow diagrams of the preparation method of the photosensitive element provided by the present invention.

Referring to FIG. 5A, a first metal film is prepared on the substrate 10 by sputtering or evaporation. The material of the substrate 10 comprises at least one of glass, alumina, silicon, polyethylene naphthalate, polyethylene terephthalate, or polyimide. The first metal film comprises a single-layer metal film or a multi-layer metal film formed by at least one metal material of molybdenum (Mo), copper (Cu), aluminum (Al), titanium (Ti), nickel (Ni), and cadmium (Cd). Then, the first metal film is patterned to form a plurality of first electrodes 20.

For example, the first electrode 20 is a single-layer or multi-layer structure of Mo, Mo/Cu/Mo, Mo/Al/Mo, Al, Al/Mo, MoTi/Cu/MoTi, MoTi/Al/MoTi, Ni/Cu/Ni, Ni/Al/Ni, Al/Ni, Cd/Cu/Cd, Cd/Al/Cd, Al/Cd, Ti/Cu/Ti, Ti/Al/Ti, or Al/Ti. It can be understood that "MoTi/Cu/MoTi" here refers to the three-layer structure of the first electrode 20, which is composed of molybdenum titanium alloy, copper metal and molybdenum titanium alloy from bottom to top. Other above-mentioned structures are similar to it and will not be repeated here.

Step S2, successively forming an N-type doped silicon layer, an undoped silicon layer, and a molybdenum oxide layer on the plurality of first electrodes.

Figure 5B:
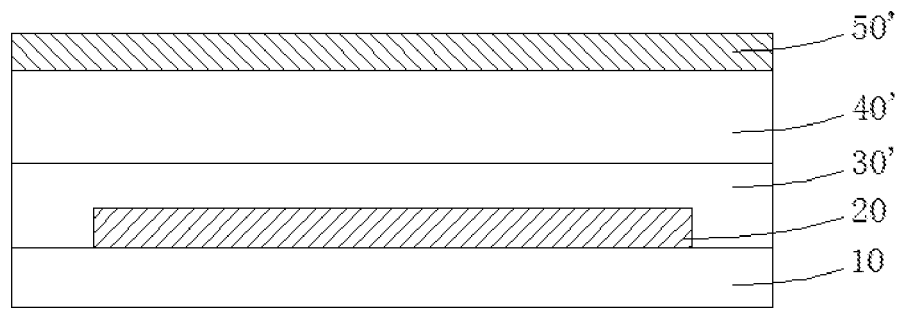
Figure 5C:
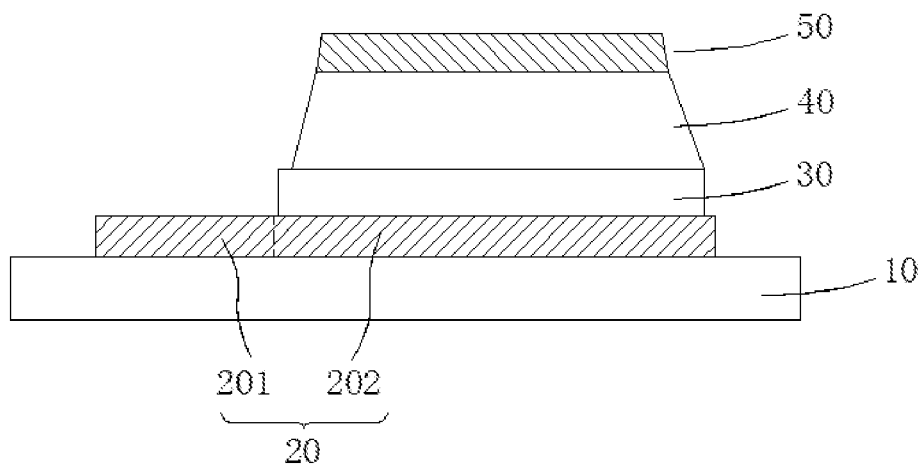

Referring to FIG. 5B and FIG. 5C, an N-type doped silicon film 30' and an undoped silicon film 40' are successively grown on the first electrode 20 and the substrate 10, wherein a first layer of silicon material (i.e., the N-type doped silicon film) can be doped with N+ impurities during the growth process. Specifically, impurity gases such as phosphine (PH3) and arsine (AsH3) are added during the growth of the first layer of silicon material to form N-type doped silicon film 30'. A second layer of silicon material (i.e., the undoped silicon film) is intrinsic silicon, which is grown on the 30' surface of the N-type doped silicon film. Wherein, growth methods of silicon materials are not limited to chemical vapor deposition, atomic layer deposition, and plasma enhanced chemical vapor deposition, and silicon materials are not limited to amorphous silicon, microcrystalline silicon, and polycrystalline silicon.

Next, a layer of transparent oxide film 50' is grown to cover the undoped silicon film 40', and the material growth mode is not limited to magnetron sputtering, chemical vapor deposition, and evaporation. In this embodiment, the transparent oxide film 50' is a molybdenum oxide film.

Then, the N-type doped silicon film 30', the undoped silicon film 40', and the transparent oxide film 50' are patterned by dry-etching or wet-etching to form the N-type doped silicon layer 30, the undoped silicon layer 40, and the molybdenum oxide layer 50 corresponding to the first electrode 20.

The first electrode 20 comprises a first region 201 configured to lap with leads and a second region 202 configured to contact the N-type doped silicon layer. The N-type doped silicon layer 30, the non-doped silicon layer 40, and the molybdenum oxide layer 50 are arranged corresponding to the second region 202. The first region 201 is reserved configured to lap with leads of other parts of subsequent photosensitive elements and sensors.

Step S3, preparing an insulating layer on the molybdenum oxide layer and the substrate, and forming a first opening exposing the molybdenum oxide layer on the insulating layer.

Figure 5D:
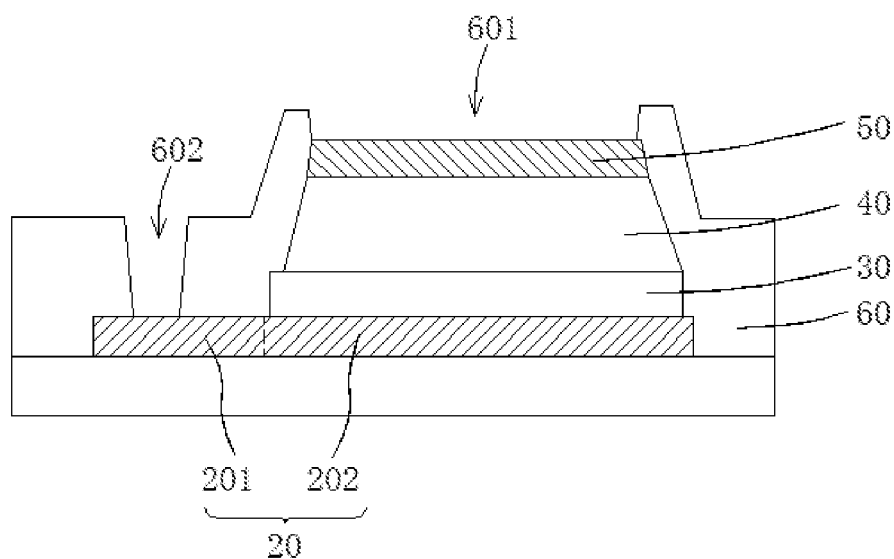

Referring to FIG. 5D, the insulating layer 60 is grown on the molybdenum oxide layer 50 and the substrate 10. The growth method is not limited to magnetron sputtering, chemical vapor deposition, atomic layer deposition, and plasma enhanced chemical vapor deposition. The material comprises but is not limited to at least one of alumina, silicon nitride, silicon dioxide, or aluminum nitride. Then, the insulating layer 60 is patterned to form the first opening 601 exposing the molybdenum oxide layer 50.

Step S4, forming a second electrode corresponding to the molybdenum oxide layer on the insulating layer, wherein the second electrode contacts the molybdenum oxide layer through the first opening.

Figure 5E:
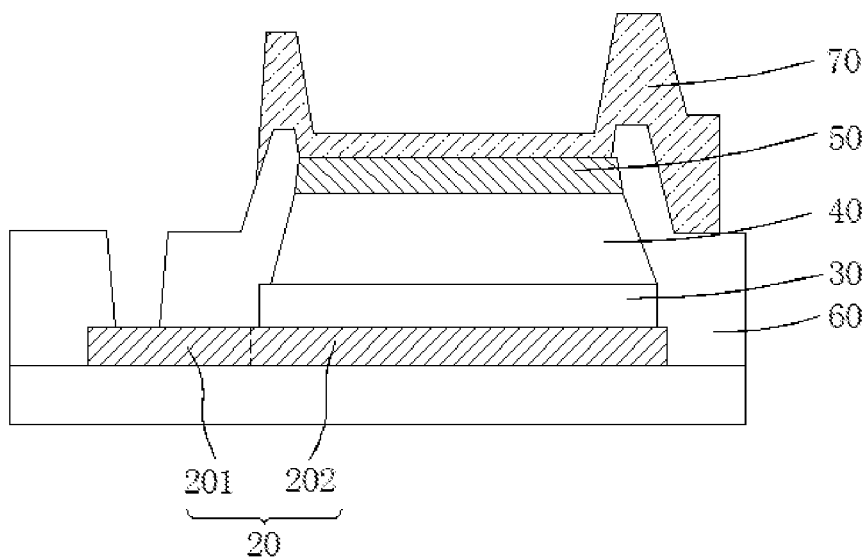

Referring to FIG. 5E, a metal oxide film is prepared on the insulating layer 60. The metal oxide film comprises, but is not limited to, a single-layer or multi-layer structure formed by at least one metal oxide material of indium zinc oxide, indium tin oxide, zinc oxide, or gallium zinc oxide. Then, the metal oxide film is patterned to form a second electrode 70 corresponding to the molybdenum oxide layer, so as to form a photodiode structure photosensitive element composed of the first electrode 20, the N-type doped silicon layer 30, the undoped silicon layer 40, the molybdenum oxide layer 50, and the second electrode 70.

In the above-mentioned preparation method of the invention, when a material of the first electrode with single-layer structure is molybdenum titanium alloy, or a material of a sublayer close to a side of the N-type doped silicon layer in the first electrode with multi-layer structure is molybdenum titanium alloy, after preparing the insulating layer on the molybdenum oxide layer and the substrate, the step of S3 further comprises following steps:

patterning the insulating layer to form the first opening exposing the molybdenum oxide layer and a second opening simultaneously exposing the second region of the first electrode (as shown in 602 in FIG. 5D), and then annealing the molybdenum oxide layer at an annealing temperature less than or equal to 350° C.

The annealing atmosphere comprises, but is not limited to, at least one of oxygen, nitrogen, air, or argon.

Annealing the molybdenum oxide layer can increase the oxygen content in the molybdenum oxide layer and improve the hole transport performance of the molybdenum oxide layer. In the above-mentioned annealing process, if the annealing temperature is too high, for example more than 350° C., the characteristics of the undoped silicon layer will be affected. In order to avoid affecting the characteristics of the undoped silicon layer, the annealing temperature should not exceed 350° C. For example, it can be 150° C., 200° C., 250° C., 300° C., etc.

Because molybdenum titanium alloy has excellent heat resistance properties and is not easily oxidized in the annealing process, when the material of the first electrode of the single-layer structure is molybdenum titanium alloy, or the material of the sublayer near the N-type doped silicon layer of the first electrode of the multi-layer structure is molybdenum titanium alloy, the first opening and the second opening can be formed simultaneously in a same process, so as to save a mask manufacturing process and cost.

Wherein, titanium metal can provide excellent adhesion, and can improve adhesion between the first electrode and the N-type doped silicon layer and the subsequent conductive layer lapped with the first electrode through the second opening, so as to improve the stability of the device.

In the above-mentioned preparation method of the invention, when a material of the first electrode with single-layer structure is a material other than molybdenum titanium alloy, or a material of a sublayer close to the side of the N-type doped silicon layer in the first electrode with multi-layer structure is material other than molybdenum titanium alloy, after preparing the insulating layer on the molybdenum oxide layer and the substrate, the step S3 further comprises following steps:

patterning the insulating layer for a first time to form the first opening exposing the molybdenum oxide layer, and annealing the molybdenum oxide layer, then patterning the insulating layer for a second time to form the second opening exposing the second region of the first electrode.

The annealing temperature and time are not limited in the annealing process, and the annealing atmosphere comprises, but is not limited to, at least one of oxygen, nitrogen, air, or argon.

Among the materials of the first electrode provided by the invention, the high temperature resistance and oxidation resistance of molybdenum titanium alloy are greater than high temperature resistance and oxidation resistance of other materials. If the sublayer of the first electrode near the side of the N-type doped silicon layer or the first electrode with single layer structure adopts other materials other than the molybdenum titanium alloy, the exposed part is easily oxidized in the annealing process, for example the molybdenum metal element in the air when heated to about 300° C., it begins to be oxidized, thereby affecting the contact performance between the first electrode and the subsequently lapped conductive layer.

Figure 6:
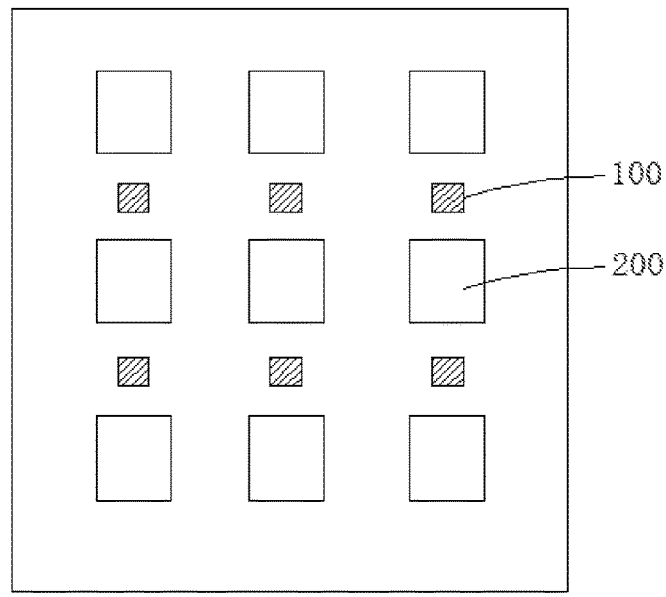
FIG. 6 is a front view of a display device provided by the present invention.

The photosensitive element of the invention can be applied to the field of display technology, and specifically, its uses include, but are not limited to, photosensitive element in the fingerprint identification sensor. The invention also provides a display device, as shown in FIG. 6, which comprises the above-mentioned photosensitive element 100 and pixel units 200, wherein the photosensitive element 100 is located between two adjacent pixel units 200. This way, pixel arrangement and display effect of the pixel units 200 will not be affected.

The display device can be one of organic light-emitting display device, liquid crystal display device, quantum dot display device, or micro light-emitting diode display device.

Figure 7:
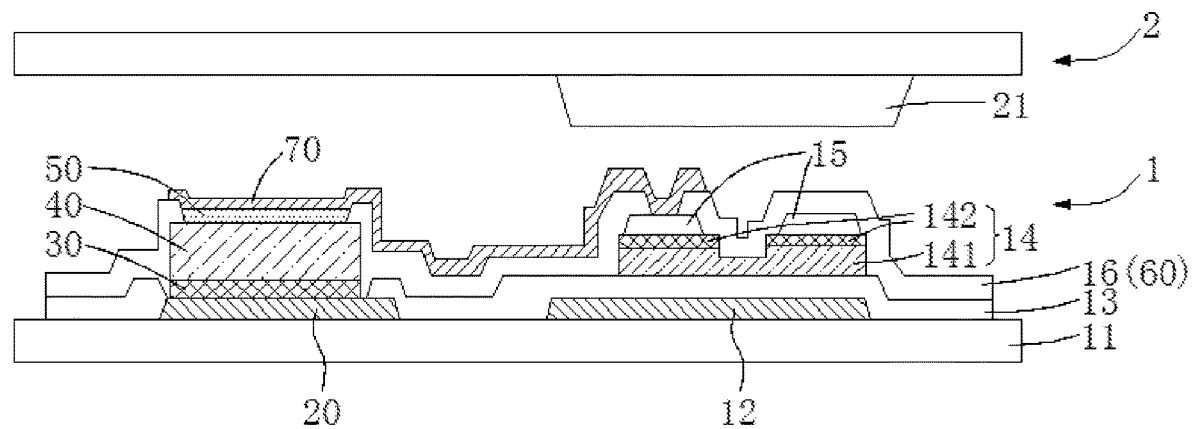
FIG. 7 is a schematic cross-sectional diagram of the display device provided by the present invention.

As shown in FIG. 7, the display device comprises a first substrate 1 and a second substrate 2, and the first substrate 1 is arranged opposite to the second substrate 2. The first substrate 1 comprises a first base 11 on which a first electrode layer is arranged, and the first electrode layer comprises a first electrode 20 and a gate electrode 12 which are arranged at intervals on the same layer. The first electrode layer is provided with a gate insulating layer 13, and a part of the gate insulating layer 13 corresponding to the first electrode 20 is etched out to expose the first electrode 20. The first electrode 20 is provided with a heterojunction, and the heterojunction comprises an N-type doped silicon layer 30, an undoped silicon layer 40, and a molybdenum oxide layer 50, which are arranged in layers, wherein the N-type doped silicon layer 30 is in contact with the first electrode 20. An active layer 14 is provided at the position where the gate insulating layer 13 faces the gate electrode 12, and the active layer 14 comprises an undoped part 141 and a doped part 142. The active layer 14 is provided with a source/drain electrode 15, and the source/drain electrode 15 is in contact with the doped part 142. The heterojunction and the source/drain electrode 15 are provided with a dielectric layer 16 (insulating layer 60), and the dielectric layer 16 exposes the molybdenum oxide layer 50 and the drain electrode 15. A second electrode 70 is arranged on the dielectric layer 16, one end of the second electrode 70 is in contact with the molybdenum oxide layer 50, and the other end of the second electrode 70 is in contact with the drain electrode 15.

The first electrode 20, the N-type doped silicon layer 30, the undoped silicon layer 40, the molybdenum oxide layer 50, and the second electrode 70 constitute the photosensitive element, and the gate electrode 12, the active layer 14, the source electrode, and the drain electrode constitute the switching thin film transistor.

A side of the second substrate 2 facing the first substrate 1 is provided with a black matrix 21, the switching thin film transistor is arranged corresponding to the black matrix 21, and the photosensitive element is arranged outside the range covered by the black matrix 21 to sense external light emitted to the photosensitive element.

The first substrate 1 also comprises a scanning line and a reading line not shown in the figure, the photosensitive element is electrically connected with the switching thin film transistor, the gate electrode 12 of the switching thin film transistor is electrically connected with the scanning line, the source electrode of the switching thin film transistor is electrically connected with the reading line, and the drain electrode of the switching thin film transistor is electrically connected with the second electrode 70 of the photosensitive element. The reading line is configured to read photocurrent signals transmitted by the photosensitive element, so as to realize the photoelectric sensing function of the photosensitive element.

The photosensitive element and the preparation method thereof provided by the present invention adopt the molybdenum oxide layer with high work function to replace the P-type material in the homojunction or heterojunction of the photosensitive element in the prior art, thus reducing the preparation demand for the P-type material. This not only saves cost, but also improves hole transmission efficiency of the photosensitive element, thereby improving the performance of the photosensitive element. The display device of the invention can realize fingerprint identification with high resolution and high sensitivity without affecting normal display.

To sum up, although the invention has been disclosed by the preferred embodiments, the preferred embodiments are not used to limit the invention. Ordinary technicians in the art can make various changes and refinements without departing from the spirit and scope of the invention. Therefore, the scope of protection of the invention is subject to the scope defined in the claims.

What is claimed is:

1. A display device, comprising a photosensitive element and pixel units, wherein the photosensitive element is located between two adjacent ones of the pixel units and comprises:
    a first base;
    a first electrode arranged on the first base;
    an N-type doped silicon layer arranged on the first electrode;
    an undoped silicon layer arranged on the N-type doped silicon layer;
    a molybdenum oxide layer arranged on the undoped silicon layer;
    a dielectric layer arranged on the molybdenum oxide layer and the first base, wherein the dielectric layer is provided with a first opening to expose the molybdenum oxide layer; and
    a second electrode arranged on the dielectric layer and the molybdenum oxide layer, wherein the second electrode contacts the molybdenum oxide layer through the first opening; and
    wherein the display device comprises a first substrate and a second substrate arranged opposite to each other, and the first substrate comprises:
    the first base;
    a first electrode layer arranged on the first base, the first electrode layer comprising the first electrode and a gate electrode spaced from the first electrode;
    a gate insulating layer arranged on the first electrode layer, wherein the gate insulating layer exposes the first electrode;
    the N-type doped silicon layer, the undoped silicon layer, and the molybdenum oxide layer arranged on the first electrode in sequence;
    an active layer arranged at a position where the gate insulating layer faces the gate electrode, wherein the active layer comprises an undoped part and a doped part;
    a source electrode and a drain electrode arranged on the active layer, wherein each of the source electrode and the drain electrode is in contact with the doped part;
    the dielectric layer arranged on the molybdenum oxide layer, the source electrode, and the drain electrode, wherein the dielectric layer exposes the molybdenum oxide layer and the drain electrode; and
    the second electrode arranged on the dielectric layer, wherein one end of the second electrode is in contact with the molybdenum oxide layer, and another end of the second electrode is in contact with the drain electrode.

2. The display device according to claim 1, wherein the gate electrode, the active layer, the source electrode, and the drain electrode constitute a switching thin film transistor, and the photosensitive element is electrically connected with the switching thin film transistor.

3. The display device according to claim 2, wherein a side of the second substrate facing the first substrate is provided with a black matrix, and the switching thin film transistor is disposed corresponding to the black matrix.

4. The display device according to claim 2, wherein the first substrate further comprises a scanning line and a reading line,
    the gate electrode of the switching thin film transistor is electrically connected with the scanning line, the source electrode of the switching thin film transistor is electrically connected with the reading line, and the drain electrode of the switching thin film transistor is electrically connected with the second electrode of the photosensitive element.

5. The display device according to claim 1, wherein the first electrode has a first region overlapping a lead wire and a second region contacting the N-type doped silicon layer, and the N-type doped silicon layer, the undoped silicon layer, the molybdenum oxide layer, and the second electrode are arranged corresponding to the second region.

6. The display device according to claim 1, wherein the first electrode comprises a single-layer or multi-layer structure formed of at least one metal material of molybdenum, copper, aluminum, titanium, nickel or cadmium, and the second electrode comprises a single-layer or multi-layer structure formed of at least one metal oxide material of indium zinc oxide, indium tin oxide, zinc oxide, or gallium zinc oxide.

7. The display device according to claim 1, wherein a work function of the molybdenum oxide layer ranges from 5.2 eV to 6.8 eV.

8. The display device according to claim 1, wherein a band gap of the molybdenum oxide layer ranges from 2.8 eV to 3.6 eV.

* * * * *